(12) United States Patent
Tonedachi

(10) Patent No.: US 9,911,721 B2
(45) Date of Patent: Mar. 6, 2018

(54) SEMICONDUCTOR DEVICE

(71) Applicant: KABUSHIKI KAISHA TOSHIBA, Tokyo (JP)

(72) Inventor: Tatsuo Tonedachi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/226,681

(22) Filed: Aug. 2, 2016

(65) Prior Publication Data
US 2017/0213812 A1     Jul. 27, 2017

(30) Foreign Application Priority Data

Jan. 26, 2016 (JP) ................... 2016-012709

(51) Int. Cl.
| | | |
|---|---|---|
| H01L 31/12 | (2006.01) | |
| H01L 25/16 | (2006.01) | |
| H01L 33/62 | (2010.01) | |
| H01L 31/16 | (2006.01) | |
| H01L 33/56 | (2010.01) | |
| H01L 33/06 | (2010.01) | |
| H01L 33/38 | (2010.01) | |

(52) U.S. Cl.
CPC .......... *H01L 25/167* (2013.01); *H01L 31/165* (2013.01); *H01L 33/06* (2013.01); *H01L 33/38* (2013.01); *H01L 33/56* (2013.01); *H01L 33/62* (2013.01)

(58) Field of Classification Search
CPC ........................... H01L 31/165; H01L 33/0062
See application file for complete search history.

(56) References Cited

U.S. PATENT DOCUMENTS

| 5,665,984 | A | * | 9/1997 | Hasegawa | ............... | H01L 33/30 |
|---|---|---|---|---|---|---|
| | | | | | | 257/101 |
| 2008/0308832 | A1 | * | 12/2008 | Hsieh | ............... | H01L 33/44 |
| | | | | | | 257/98 |
| 2011/0210345 | A1 | * | 9/2011 | Lim | ............... | H01L 33/20 |
| | | | | | | 257/88 |
| 2014/0061678 | A1 | * | 3/2014 | Kotani | ............... | H01L 31/167 |
| | | | | | | 257/82 |

(Continued)

FOREIGN PATENT DOCUMENTS

| JP | 3141373 B2 | 3/2001 |
|---|---|---|
| JP | 3745174 B2 | 2/2006 |
| JP | 2010028049 A | 2/2010 |

*Primary Examiner* — Sitaramarao S Yechuri
(74) *Attorney, Agent, or Firm* — Patterson & Sheridan, LLP

(57) ABSTRACT

A semiconductor device includes a light emitting element comprising a substrate having a first and a second surface and an outer edge connecting the first and second surfaces. A light emitting layer is on a central portion of the first surface but not on a peripheral portion between the central portion and the outer edge of the substrate. A first insulating layer is disposed on the peripheral portion of the first surface, a side surface of the light emitting layer, and a third surface of the light emitting layer that is spaced from the first surface of the substrate. A first electrode is electrically contacting the third surface of the light emitting layer. A light receiving element is provided in a propagation path of light emitted from the light emitting element.

16 Claims, 2 Drawing Sheets

(56) References Cited

U.S. PATENT DOCUMENTS

2014/0264359 A1* 9/2014 Zimmerman ........... H01L 33/64
  257/76
2015/0274894 A1* 10/2015 Sato ........................ C08K 5/56
  257/100

* cited by examiner

SEMICONDUCTOR DEVICE

CROSS-REFERENCE TO RELATED APPLICATION

This application is based upon and claims the benefit of priority from. Japanese Patent Application No. 2016-012709, filed on Jan. 26, 2016, the entire contents of which are incorporated herein by reference.

FIELD

Embodiments described herein relate generally to a semiconductor device including a light emitting layer.

BACKGROUND

A photocoupler includes a light emitting diode (LED) and a light receiving element which are contained in one integrated package. The photocoupler transmits light signals from the LED to the light receiving element. The LED and the light receiving element are typically arranged so as to face each at fixed distance. An "inner mold resin" is disposed in the light path between the LED and the light receiving element and is also used to at least partially encapsulate or seal the LED and light receiving element.

An LED for a photocoupler typically emits an infrared light. The LED has a light emitting layer that is disposed on a gallium arsenide (GaAs) substrate or the like. If the light emitting layer comes into direct contact with the inner mold resin, the light emitting layer will receive stress (due to differences in thermal expansion coefficients or the like) that might cause the light emitting layer to crack after thermal cycling events. Thus, the light intensity output by the LED and/or the lifetime of the LED may be reduced.

To address this concern, some portion of the light emitting layer is often first covered with an encapsulation resin material different from the inner mold resin, and then the inner mold resin is disposed on the encapsulation resin. The encapsulation resin material is a thermosetting or thermocurable resin such as a silicone resin that can be formed by potting of the uncured resin.

In general, multiple LED components are simultaneously formed on a single wafer then diced into separate LED chips. In constructing a photocoupler, an LED chip is electrically connected to a lead frame or a terminal element using bonding wire or the like. After the bonding wire is bonded to the LED chip, the encapsulation resin is disposed on the LED chip. The forming of the encapsulation resin on the LED chip at this stage introduces additional process steps and complexity. Therefore, in some instances, the encapsulation resin may not be formed correctly on the LED chip but rather might be formed on the light receiving diode, or the encapsulation resin may be omitted by mistake.

DETAILED DESCRIPTION

In general, according to one embodiment, a semiconductor device comprises a light emitting element including a substrate having a first surface, a second surface opposite the first surface, and an outer edge surface connecting the first and second surfaces, and light emitting layer disposed on a central portion of the first surface and not on a peripheral portion of the first surface that is between the central portion and the outer edge surface of the substrate and surrounding the central portion. A first insulating layer is disposed on the peripheral portion of the first surface, a side surface of the light emitting layer, and a third surface of the light emitting layer that is spaced from the first surface of the substrate. A first electrode of the light emitting element is electrically contacting the third surface of the light emitting layer. A light receiving element is disposed in a propagation path of light emitted from the light emitting element.

Hereinafter, embodiments will be described in detail.

First Embodiment

Figure 1:
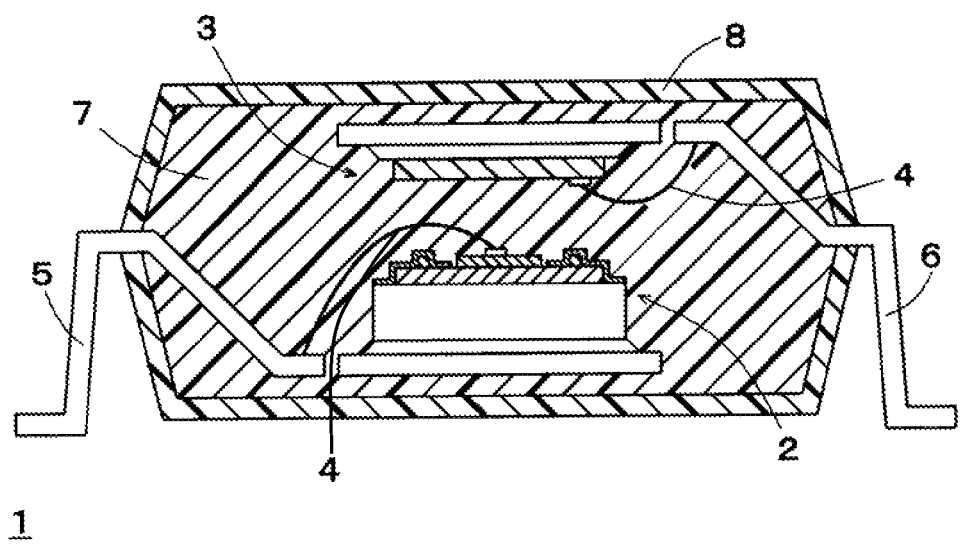
FIG. 1 is a cross-sectional view of a semiconductor device according to a first embodiment.

FIG. 1 is a cross-sectional view of a semiconductor device according to a first embodiment. The semiconductor device in FIG. 1 is a photocoupler 1 including a light emitting element (LED) 2 and a light receiving element 3. The light receiving element 3 is arranged so as to face the LED 2. The LED 2 is connected to a first lead frame 5 by a bonding wire 4, and the light receiving element 3 is connected to a second lead frame 6 by another bonding wire 4.

LED 2 emits, for example, infrared light. The light receiving element 3 receives light from the LED 2 and converts the light into an electric signal.

The LED 2, the light receiving element 3, and portions of the first and second lead frames 5 and 6 are covered with an inner mold resin (second insulating layer) 7. The inner mold resin 7 is transparent (or significantly so) to the light from the LED 2. The inner mold resin 7 is a resin material that is formed using, for example, epoxy resin as a base material.

The inner mold resin 7 is covered with an outer mold resin 8. The outer mold resin 8 is opaque (or substantially so) to light emitted from the LED 2. The outer mold resin 8 may include fillers or colorants to make the resin black. The outer mold resin portion 8 forms outer portion the photocoupler package and is thus shown on the outside of the photocoupler 1 in FIG. 1. Portions of the first lead frame 5 and the second lead frame 6 protrude from opposite outer wall surfaces of the outer mold resin portion 8.

Figure 2:
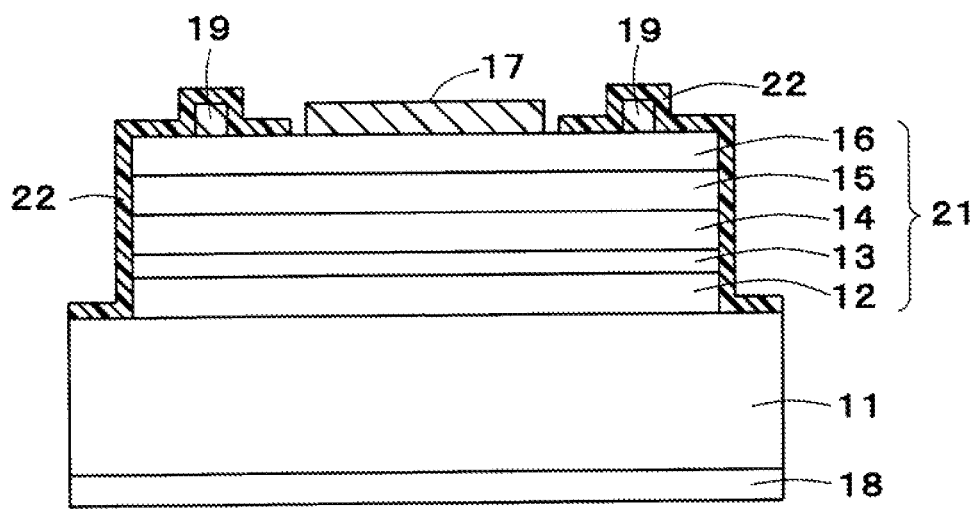
FIG. 2 is a view illustrating a cross-section structure of an LED such as in a photocoupler depicted in FIG. 1.

FIG. 2 is a view illustrating a cross-sectional structure of the LED 2 in the photocoupler 1 in FIG. 1. As illustrated in FIG. 2, the LED 2 includes a stack of a GaAs substrate 11, an n-type clad layer 12, an active layer 13, a p-type clad layer 14, a current diffusion layer 15, and a contact layer 16, which are sequentially stacked in this order. In some embodiments, additional layers may be included the stack, such as a buffer layer, a current blocking layer, or other layers but these are not specifically depicted in FIG. 2.

A conductivity type of the GaAs substrate 11 may be a p type or an n type. In the present embodiment, an example in which the GaAs substrate 11 is used is described, but a substrate including other compound semiconductors such as GaP may be used.

The n-type clad layer 12 is, for example, $Al_xGa_{1-x}As$ ($0<x<1$). The p-type clad layer 14 is, for example, $Al_yGa_{1-y}As$ ($0<y<1$). The active layer 13 includes, for example, an InAlGaP-based multiple quantum well (MQW) layer. The contact layer 16 is, for example, a GaAs-based semiconductor layer. Specific materials which form the respective layers that configure the stack may be varied in composition or type.

A p-side electrode 17 is arranged on an upper surface of the contact layer 16, and an n-side electrode 18 is arranged on a rear surface side of the GaAs substrate 11. In other examples, the n-side electrode 18 may be arranged on the same side as the p-side electrode 17.

In the present disclosure, the stacked structure which includes the n-type clad layer 12, the active layer 13, the p-type clad layer 14, the current diffusion layer 15, and the contact layer 16 is collectively referred to as a light emitting layer 21.

The light emitting layer 21 is arranged on a central portion of the GaAs substrate 11 and does not extend to the outer edge (s) of the GaAs substrate 11. That is, a side surface of the light emitting layer 21 is setback from a side surface (outer edge) of the GaAs substrate 11, as illustrated in FIG. 2.

A first insulating layer 22 is arranged over the outside surfaces of the light emitting layer 21. A portion of the first insulating layer 22 is disposed on a portion of the upper surface (side on which p-side electrode 17 is disposed in FIG. 2) of the light emitting layer 21. A portion of the first insulating layer 22 is disposed on an upper surface of the GaAs substrate 11 between the side surface of the light emitting layer 21 and the outside edge of the GaAs substrate 11. That is, the first insulating layer 22 in FIG. 2 is disposed on the upper surface of the light emitting layer 21, the side (vertical) surfaces of the light emitting layer 21, and a portion of the upper surface of the GaAs substrate 11 that is not covered by the light emitting layer 21.

The first insulating layer 22 is, for example, a resin material comprising polyimide (e.g., a polyimide layer). In a structure in which the inner mold resin 7 directly contacts the upper surface and the side surface of the light emitting layer 21, the light emitting layer 21 can be cracked by stress caused by or transmitted through the inner mold resin 7. When the light emitting layer 21 is cracked, the cracked portion has much higher resistance and will consequently become more heated when power is applied to the device. Accordingly, the light emitting layer 21 is degraded, light intensity is reduced, and device lifetime is shortened.

In contrast to this scenario, a portion of the upper surface and the side surface of the light emitting layer 21 is covered with the first insulating layer 22, as illustrated in FIG. 2. Accordingly, the light emitting layer 21 does not come into direct contact with the inner mold resin 7, whereby the light emitting layer 21 is less affected by stress from the inner mold resin 7. Thus, it is possible to prevent the light intensity and light emission lifetime from being reduced. In this manner, the first insulating layer 22 functions as a stress mitigation layer which mitigates or reduces the impact of stresses from the inner mold resin 7.

As described above, the light emitting layer 21 is a stack body (layer stack) which includes multiple layers, and particularly, the active layer 13 of the light emitting layer 21 is highly susceptible to damage by stresses from the inner mold resin 7. The active layer 13 is provided as a central layer in the light emitting layer 21, and thus generally does not come into contact with the inner mold resin 7 at the upper side of the light emitting layer 21. Hence, the active layer 13 is hardly affected by the stress from the inner mold resin 7 on the upper side light emitting layer 21. However, when there is no the first insulating layer 22, the exposed side surfaces of the active layer 13 may come in contact with the inner mold resin 7, and the active layer 13 may be affected by stresses from the inner mold resin 7 applied on the side surfaces of the active layer 13. However, in the present embodiment, as described above, the side surfaces of the active layer 13 is covered with the first insulating layer 22, thus the side surfaces of the active layer 13 do not directly contact the inner mold resin 7. Hence, the active layer 13 will hardly be affected by stresses from the inner mold resin portion 7.

Figure 3:
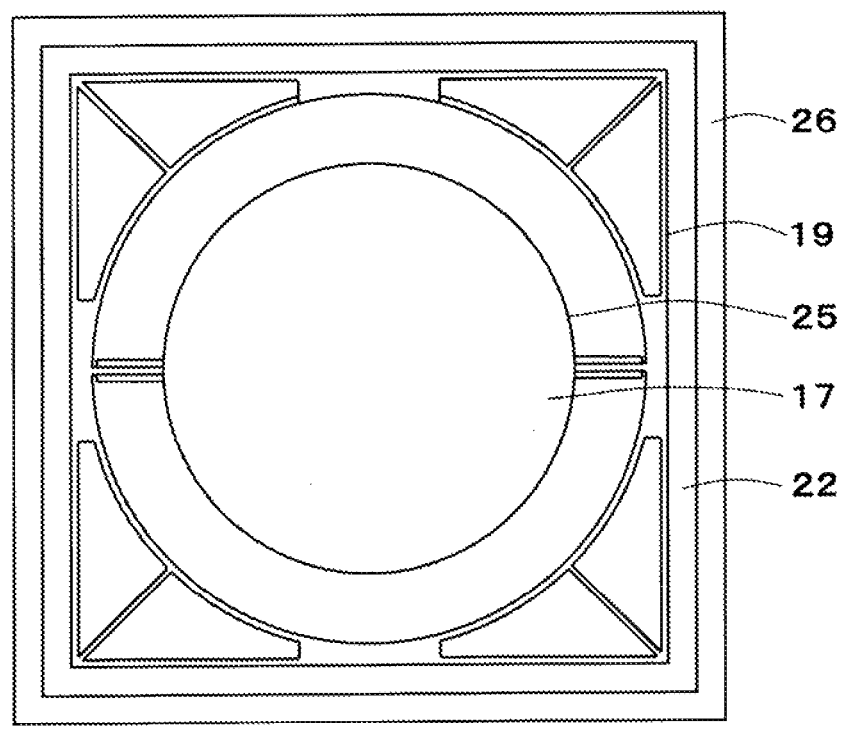
FIG. 3 is a plan view in which the LED in FIG. 2 as viewed from an overhead direction.

FIG. 3 is a plan view in which the LED 2 in FIG. 2 is viewed from the top (from the p-side electrode 17 side in FIG. 2). The p-side electrode 17 is a ring type and arranged in the central portion of the LED 2, and multiple thin wire electrodes 19 are arranged on periphery thereof. Shapes and sizes of the p-type electrode 17 and the thin wire electrode 19 in FIG. 3 are just an example, and any shapes and sizes may be adopted. Light from an upper surface side of the LED 2 is emitted from gaps between the p-type electrode 17 and the thin wire electrode 19. In general, the light from the LED 2 is emitted not only from the upper surface side but also from the side surface of the light emitting layer 21.

In the example in FIG. 3, a slight gap 25 is formed on a periphery portion of the p-type electrode 17, and the entire upper surface of the light emitting layer 21 on an outer side of the gap 25 is covered with the first insulating layer 22. The bonding wire 4 (which is not illustrated in FIG. 2) is connected to a central portion of the p-type electrode 17, but the upper surface of the p-type electrode 17 may also be covered with the first insulating layer 22, excepting for a portion directly connected to the bonding wire 4.

As described above light emitting layer 21 is setback or offset from the outer edge of the upper surface of the GaAs substrate 11 by some amount. The portion of the GaAs substrate 11 left uncovered by light emitting layer 21 may be referred to as predetermined range 26 and is depicted in FIG. 3. The first insulating layer 22 is contacting the GaAs substrate 11 in the predetermined range 26.

In this manner, in the first embodiment, the side surface of the light emitting layer 21 which is arranged on the GaAs substrate 11 of the LED 2 is arranged on a more internal side than a periphery portion of the GaAs substrate 11, and the region from the upper surface of the GaAs substrate 11 to the side surface of the light emitting layer 21 and a portion of the upper surface of the light emitting layer 21 is covered with the first insulating layer 22. Accordingly, the upper surface and the side surface of the light emitting layer 21 is not in contact with the inner mold resin 7, whereby the light emitting layer 21 is less affected by the stress from the inner mold resin 7. Hence, it is possible to prevent the light intensity and light emission lifetime of the light emitting layer 21 from being reduced.

The first insulating layer 22 can be formed on the LED 2 while the LED 2 is still in a wafer state with several other devices rather than in a post-diced state. As such, the fabrication processes of the LED for use in a photocoupler can be simplified because the first insulating layer 22 can be formed on several LEDs 2 at once rather than each individually in a post-dice assembly process. In contrast, to cover the periphery of each light emitting layer 21 with an encapsulation resin material, each chip of the LED 2 must first be separated from the wafer and the bonding wires 4 already bonded to each LED 2. Only thereafter, can the encapsulating resin material be potted on to each chip, which increases manufacturing complexity and can reduce device yield and performance. In contrast to this, according to the present embodiment, the first insulating layers 22 are simultaneously formed on each LED prior to wafer dicing, and thus, the fabrication processes complexity can be considerably reduced, and in general the film coverage quality of the first insulating layer 22 will be higher than a post-dice, post-wire bonding application of an encapsulation resin material.

Second Embodiment

There may be cases where the first insulating layer 22 does not have good adhesion to the GaAs substrate 11. When adhesion between the first insulating layer 22 and the GaAs substrate 11 is not good, a gap can be formed between the first insulating layer 22 and the GaAs substrate 11. Then, moisture or the like can be introduced the light emitting layer 21 through the gap, whereby light intensity or light emission lifetime is reduced, and peeling of the first insulating layer 22 can occur.

Hence, in a second embodiment, the first insulating layer 22 has a double-layered structure, and a material having good adherence to the GaAs substrate 11 is arranged on a side which is in contact with the GaAs substrate 11.

Figure 4:
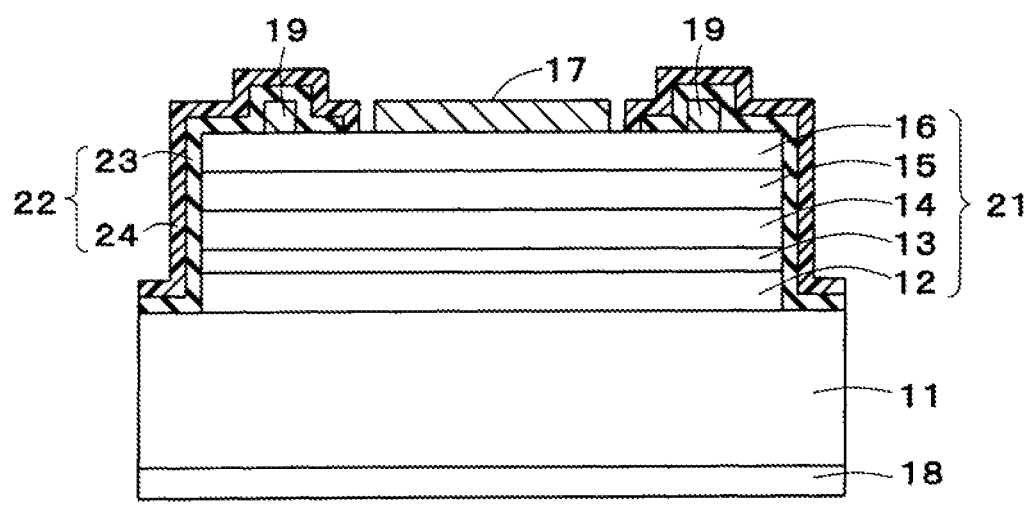
FIG. 4 is a view illustrating a cross-sectional structure of an LED in a semiconductor device according to a second embodiment.

FIG. 4 is a view illustrating a cross-section structure of the LED 2 in a semiconductor device according to the second embodiment. The LED 2 in FIG. 4 has a first insulating layer 22 comprising a stacked structure of a first layer 23 and a second layer 24, instead of unitary first insulating layer 22 depicted in FIG. 1.

The first layer 23 covers an upper surface of the GaAs substrate 11, a side surface of the light emitting layer 21, and a portion of an upper surface of the light emitting layer 21. The first layer 23 can be an oxide film such as silicon oxide ($SiO_2$) or a nitride film such as silicon nitride (SiN). The second layer 24 is disposed on the first layer 23 and comprises an organic material such as polymer resin. The second layer 24 is, for example, a polyimide layer.

A material having a good adherence to the GaAs substrate 11 is selected for the first layer 23. Accordingly, there is less possibility that a gap will occur between the first layer 23 and the GaAs substrate 11. In addition, the second layer 24 which is in contact with the inner mold resin 7, and can function as a stress mitigation layer which mitigates the stresses applied from the inner mold resin 7 to the light emitting layer 21. Furthermore, for example, the second layer 24 may have a function to block metal ions.

In this manner, in the second embodiment, the first insulating layer 22 has a double-layered layer. The he first layer 23 of first insulating layer 22 has good adherence to the GaAs substrate 11 and is arranged to be in direct contact with the GaAs substrate 11. The second layer 24 of first insulating layer 22, which can function as a stress mitigation layer, is arranged to be in direct contact with the inner mold resin 7. Accordingly, the light emitting layer 21 is less affected by the stresses applied from the inner mold resin 7, and adhesion between the light emitting layer 21 and the first insulating layer 22 can be increased.

In the first and second embodiments described above, an example in which a semiconductor device is applied to the photocoupler 1 is described, but the semiconductor device is not limited to the photocoupler 1. For example, the semiconductor device can be applied to an infrared light sensor which emits infrared light, an interrupter sensor, or the like. In a case where the semiconductor device is applied to an infrared light sensor or an interrupter sensor, the light receiving element 3 illustrated in FIG. 1 is not required.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
a light emitting element including:
  a substrate having a first surface, a second surface opposite the first surface, and an outer edge surface connecting the first and second surfaces;
  a light emitting layer disposed on a central portion of the first surface and not on a peripheral portion of the first surface that is between the central portion and the outer edge surface of the substrate and surrounding the central portion;
  a first insulating layer disposed on the peripheral portion of the first surface, a side surface of the light emitting layer, and a first portion of a third surface of the light emitting layer that is spaced from the first surface of the substrate, the first insulating layer including an inorganic insulating layer and an organic insulating layer, the inorganic insulating layer being directly in contact with the peripheral portion of the first surface, the side surface of the light emitting layer, and the first portion of the third surface of the light emitting layer, and the organic insulating layer being disposed on the inorganic insulating layer, a second portion of the third surface adjacent to the first portion being left exposed by the first insulating layer; and
  a first electrode electrically contacting the portion of the third surface of the light emitting layer;
a light receiving element in a propagation path of light emitted from the light emitting element;
a resin material that is transparent to the light emitted by the light emitting element and between the light emitting element and the light receiving element, the resin material encapsulating the light emitting and light receiving elements, wherein
the organic insulating layer is in direct contact with the resin material.

2. The semiconductor device according to claim 1, wherein the organic insulating layer is polyimide.

3. The semiconductor device according to claim 1, wherein the organic insulating layer is disposed on the inorganic insulating layer such that the inorganic insulating layer is between the organic insulating layer and the peripheral portion of the first surface, the side surface of the light emitting layer, and the third surface of the light emitting layer.

4. The semiconductor device according to claim 1, wherein the inorganic insulating layer is one of silicon oxide and silicon nitride.

5. The semiconductor device according to claim 4, wherein the organic insulating layer is a polymer.

6. The semiconductor device according to claim 5, wherein the polymer is polyimide.

7. The semiconductor device according to claim 1, wherein the resin material is an epoxy resin.

8. The semiconductor device according to claim 1, wherein the substrate is a compound semiconductor.

9. The semiconductor device according to claim 1, wherein
the first electrode is provided as a pad portion and a thin wire portion surrounding the pad portion,
a bonding wire is connected to the pad portion, and
the thin wire portion is between the first insulating layer and the third surface of the light emitting layer.

10. The semiconductor device according to claim 1, wherein the light emitting element emits infrared light.

11. The semiconductor device according to claim 1, wherein first insulating layer is substantially constant in thickness.

12. The semiconductor device according to claim 1, wherein the organic insulating layer is a polymer.

13. A light emitting element, comprising:
a compound semiconductor substrate having a first surface, a second surface opposite the first surface, and an outer edge surface connecting the first and second surfaces;
a light emitting layer stack disposed on a central portion of the first surface and not on a peripheral portion of the first surface that is between the central portion and the outer edge surface of the substrate and surrounding the central portion, the light emitting layer stack including:
a n-type clad layer on the central portion of the first surface;
an active layer disposed on the n-type clad layer;
a p-type clad layer disposed on the active layer;
a current diffusion layer disposed on the p-type clad layer; and
a contact layer disposed on the current diffusion layer;
a first electrode disposed on and electrically contacting an upper surface of the contact layer, the first electrode including a pad portion on a central portion of the upper surface of the contact layer and a thin wire portion disposed on the upper surface of the contact layer and surrounding the pad portion;
a second electrode disposed on the second surface of the compound semiconductor substrate and electrically contacting the n-type clad layer through the compound semiconductor substrate;
a first insulating layer disposed on the peripheral portion of the first surface, a side surface of the light emitting layer stack, and a portion of the upper surface of the contact layer;
a bonding wire bonded to the pad portion of the first electrode; and
a resin material disposed on the first insulating layer, wherein
the compound semiconductor substrate is gallium arsenide,
the active layer is a multiple quantum well structure,
the second electrode is soldered to a lead frame,
the pad portion is circular when viewed from a direction orthogonal to the upper surface of the contact layer, and
the first insulating layer includes an inorganic insulating layer and an organic insulating layer, the inorganic insulating layer being directly in contact with the peripheral portion of the first surface, the side surface of the light emitting layer stack, and the portion of the upper surface of the contact layer, and the organic insulating layer being disposed on the inorganic insulating layer.

14. The light emitting element of claim 13, wherein the organic insulating layer of the first insulating layer is a polyimide material and substantially constant in thickness.

15. A photocoupler, comprising:
a light emitting element disposed on a lead frame;
a light receiving element disposed so as to receive a light signal emitted by the light emitting element, wherein the light emitting element includes:
a compound semiconductor substrate having a first surface, a second surface opposite the first surface, and an outer edge surface connecting the first and second surfaces;
a light emitting layer stack disposed on a central portion of the first surface and not on a peripheral portion of the first surface that is between the central portion and the outer edge surface of the substrate and surrounding the central portion;
a first electrode disposed on and electrically contacting an upper surface of the light emitting layer stack, the first electrode including a pad portion on a central portion of the upper surface and a thin wire portion disposed on the upper surface and surrounding the pad portion;
a second electrode disposed on the second surface of the compound semiconductor substrate; and
a first insulating layer disposed on the peripheral portion of the first surface, a side surface of the light emitting layer stack, and a first portion of the upper surface of the light emitting layer stack;
a bonding wire bonded to the pad portion of the first electrode;
a first resin material between the light emitting element and the light receiving element and directly contacting the first insulating layer; and
a second resin material encapsulating the first resin material, the light emitting element, and the light receiving element, wherein
the first insulating layer includes an inorganic insulating layer and an organic insulating layer, the inorganic insulating layer being directly in contact with the peripheral portion of the first surface, the side surface of the light emitting layer stack, and the first portion of the upper surface of the light emitting stack, and the organic insulating layer being disposed on the inorganic insulating layer and in direct contact with the first resin material, a second portion of the upper surface of the light emitting stack being left exposed by the first insulating layer.

16. The photocoupler of claim 15, wherein the light emitting layer stack includes:
a n-type clad layer on the central portion of the first surface;
an active layer disposed on the n-type clad layer;
a p-type clad layer disposed on the active layer;
a current diffusion layer disposed on the p-type clad layer; and
a contact layer disposed on the current diffusion layer.

* * * * *